(12) United States Patent
Wi et al.

(10) Patent No.: US 10,395,897 B1
(45) Date of Patent: Aug. 27, 2019

(54) VIRTUAL IMPEDANCE AUTO MATCHING METHOD

(71) Applicant: Newpowerplasma Co., Ltd., Pyoungtak-si, Gyeonggi-do (KR)

(72) Inventors: SoonIm Wi, Yongin-si (KR); HongKweon Moon, Goyang-si (KR); KookYoung Choi, Anyang-si (KR); KyoungWoon Boo, Suwon-si (KR); SeaWon Kim, Suwon-si (KR)

(73) Assignee: NEWPOWERPLASMA CO., LTD., Pyoungtak-si, Gyeonggi-do (KR)

( * ) Notice: Subject to any disclaimer, the term of this patent is extended or adjusted under 35 U.S.C. 154(b) by 0 days.

(21) Appl. No.: 16/352,000

(22) Filed: Mar. 13, 2019

(30) Foreign Application Priority Data

Apr. 24, 2018 (KR) ........................ 10-2018-0047284

(51) Int. Cl.
*H01J 7/24* (2006.01)
*H01J 37/32* (2006.01)
*H03H 7/40* (2006.01)

(52) U.S. Cl.
CPC ......... *H01J 37/32183* (2013.01); *H03H 7/40* (2013.01); *H01J 2237/334* (2013.01)

(58) Field of Classification Search
CPC ....... H05H 1/46; H05H 1/24; H01J 37/32082; H01J 37/32192; H01J 37/32174; H01J 37/32623; H01J 37/321; H01J 37/3211; B82Y 10/00; G01R 19/0092; G01R 19/2513; G01R 21/133; G01R 19/25; G01R 27/02; G01R 27/2605; G01R 21/1331; G01R 27/28; G01R 31/31708; G01R 31/31924; G01R 31/2886; G01R 31/2889; G01R 1/30; G06F 1/3203; G06F 17/5036; G06F 1/26; H03H 7/40; G06Q 50/06; B23H 7/04

See application file for complete search history.

(56) References Cited

U.S. PATENT DOCUMENTS

2014/0214351 A1* 7/2014 Valcore, Jr. ........ H01J 37/32183 702/65
2017/0330731 A1* 11/2017 Van Zyl ............ H01J 37/32183

FOREIGN PATENT DOCUMENTS

KR 10-2005-0089114 A 9/2005

* cited by examiner

*Primary Examiner* — Minh D A
(74) *Attorney, Agent, or Firm* — Rabin & Berdo, P.C.

(57) ABSTRACT

A virtual impedance auto matching method includes (a) deciding an input parameter of an RF generator and a load condition parameter of a plasma chamber, (b) applying an RF ON signal to an impedance matcher, (c) determining whether initial preset positions of a load vacuum variable capacitor and a tuning vacuum variable capacitor constituting the impedance matcher are within a matching range, (d) applying the RF OFF signal to the impedance matcher and generating an alarm signal indicating deviation from the matching range, when step (c) is not satisfied, (e) starting matching by operating the impedance matcher when step (c) is satisfied, and (f) deciding the initial preset positions of the load vacuum variable capacitor and the tuning vacuum variable capacitor by analyzing a magnitude error and a phase error with respect to 50+j0 according to an impedance change, when the matching is completed.

3 Claims, 6 Drawing Sheets

FIG. 6

| No. | RF_On Time | C1Pos(%) | C2Pos(%) | C1_Encoder | C2_Encoder | Error Data | | | Complex Imp. | | (/1000) | Matching | Forward Power | Reflect Power | Process | Recipe | Step |
|---|---|---|---|---|---|---|---|---|---|---|---|---|---|---|---|---|---|
| | | | | | | Mag | Phase | Zm_R | Zm_X | | | | | | | | |
| 1 | 00:00.2 | 9.7 | 70.6 | 1499 | 11991 | -1.1 | 1.2 | 55 | 8.1 | 0.144 | | 1394 | 62 | | | |
| 2 | 00:00.4 | 7 | 72.4 | 1204 | 11805 | -4.5 | 6.6 | 46 | 6.8 | 0.087 | | 3872 | 47 | | | |
| 3 | 00:00.6 | 5.8 | 74.9 | 1218 | 12385 | -2.6 | 6.9 | 47.2 | 5.7 | 0.082 | x | 6869 | 22 | Etching | Seasoning | x |
| 4 | 00:00.8 | 5.1 | 77.2 | 1167 | 12550 | -0.9 | 7.1 | 48.3 | 3.7 | 0.027 | | 8920 | 0 | | | |
| 5 | 00:01.0 | 4.8 | 78.8 | 1146 | 12778 | -0.5 | 5.2 | 49.2 | 4.2 | 0.009 | | 10224 | 0 | | | |
| 6 | 00:01.2 | 4.5 | 79.5 | 1134 | 12964 | 0 | 5 | 49.8 | 4.4 | 0.004 | o | 12652 | 0 | | | |
| 7 | 00:01.4 | 4.2 | 80.7 | 1102 | 13066 | 0.1 | 0.9 | 50.1 | 0.6 | 0.001 | | 14000 | 0 | | | |
| 8 | 00:01.6 | 4.2 | 80.7 | 1102 | 13066 | 0.1 | 0.9 | 50.1 | 0.8 | 0.001 | | 14000 | 0 | | | |

VIRTUAL IMPEDANCE AUTO MATCHING METHOD

TECHNICAL FIELD

The present disclosure relates to a virtual impedance auto matching method in which an impedance auto matching process can be examined in advance by virtually performing impedance matching before connecting a matcher for impedance matching between an RF generator and a plasma chamber, an unmatchable area can be avoided when applied to an actual process, process optimization can be implemented by extracting preset position data of a vacuum variable capacitor (VVC) for initial ignition and matching success, initial reflected wave power of a process can be suppressed, and an auto matching time can be considerably reduced.

BACKGROUND ART

Plasma discharge is used for gas excitation for generating active gas including ions, free radicals, atoms, and molecules. The active gas is widely used in various fields, and is representatively used in processes such as etching, chemical vapor deposition (CVD), and asking in semiconductor manufacturing processes, for example.

FIG. 1 is a block diagram illustrating a general plasma power supply system. Referring to FIG. 1, a facility for generating plasma largely includes a plasma power supply 10 for supplying power, an impedance matching box 20 for supplying maximum power, and a plasma load 30. The plasma power supply 10 includes an RF generator that oscillates at a high frequency, and the impedance matching box 20 matches the impedance of an output terminal of the plasma power supply 10 with the impedance of the plasma load 30, for example, a load such as a processing chamber, which is not fixed and changed due to the kind of a process or a change in internal environments, thereby allowing desired high frequency power to be applied to the processing chamber.

Typically, the impedance of the output terminal of the plasma power supply 10 is fixed to about 50Ω, but the impedance of the plasma load 30 is variously changed. The impedance matching box 20 varies impedance according to a change in the impedance of a load to match impedance between the plasma power supply 10 and the processing chamber so as to reduce reflected waves from the plasma load 30, thereby preventing damage to the RF generator and allowing high frequency RF power to be completely used in the processing chamber without loss.

FIG. 2 is a circuit diagram illustrating the impedance matching box including a vacuum variable capacitor. Referring to FIG. 2, an inductor 41 and a tuning capacitor 42 are serially connected between the plasma power supply 10 and the plasma load 30, and a load capacitor 43 is installed between an input terminal of the inductor 41 and a ground. In general, the tuning capacitor 42 and the load capacitor 43 are varied to adjust impedance in a state in which the value of the inductor 41 is fixed, and each capacitor includes a vacuum variable capacitor (VVC).

A controller 40 provided in the impedance matching box 20 measures power inputted from the RF generator and power reflected from the plasma chamber and operates an operating mechanism that adjusts the position of the VVC, thereby performing impedance variable control. However, the position of the VVC, where impedance matching occurs, varies depending on the type of a semiconductor process, a process recipe, each process step and the like, and when the initial position of the VVC is erroneously selected, an area where impedance matching is not possible may occur and process fail may occur.

Furthermore, when there is a large deviation between the initial position of the VVC and the final position of the VVC where matching occurs, a time required for impedance matching may increase, power reflected from the chamber may increase at the initial stage of the process, and the continuity of the process may deteriorate.

CITATION LIST

Patent Literature (Patent Literature 1) Korean Unexamined Patent Publication No. 10-2005-0089114

DISCLOSURE

Technical Problem

Accordingly, the present invention has been made keeping in mind the above problems occurring in the related art, and an object of the present invention is to provide a virtual impedance auto matching method in which initial preset positions of vacuum variable capacitors can be optimized for each process and step by performing virtual impedance matching according to a process type, a process recipe, and each process step, the stability and continuity of the process can be improved by avoiding an unmatchable area when applied to an actual process, initial reflected wave power of the process can be suppressed, and an auto matching time can be considerably reduced.

Technical Solution

In order to accomplish the above objects, there is provided a virtual impedance auto matching method in which virtual matching is performed by connecting an impedance matcher to a computing device before the impedance matcher is put into a process, the impedance matcher being installed between an RF generator that generates an RF signal that oscillates at a high frequency and a plasma chamber to match impedance of an output terminal of the RF generator with impedance of the plasma chamber, the virtual impedance auto matching method including the steps of: (a) deciding an input parameter of the RF generator and a load condition parameter of the plasma chamber according to a process type, a process recipe, and each process step of the process recipe; (b) applying an RF ON signal to the impedance matcher based on the input parameter of the RF generator for each process step; (c) determining whether initial preset positions of a load vacuum variable capacitor and a tuning vacuum variable capacitor constituting the impedance matcher are within a matching range; (d) applying the RF OFF signal to the impedance matcher and generating an alarm signal indicating deviation of the matching range, when step (c) is not satisfied; (e) starting matching by operating the impedance matcher when step (c) is satisfied; (f) deciding the initial preset positions of the load vacuum variable capacitor and the tuning vacuum variable capacitor by analyzing a magnitude error and a phase error with respect to 50+j0 according to an impedance change for each process step where the matching is successful, when the matching is completed; and (g) performing step (a) to step (f) for each process step and sending the initial preset positions of the load vacuum variable capacitor and the tuning vacuum variable capacitor for each process step to the impedance matcher.

Advantageous Effects

According to the virtual impedance auto matching method of the present invention, process stability can be improved by deciding the initial preset positions of the vacuum variable capacitors (VVC) where an unmatchable area can be avoided according to process conditions of the plasma load side and the initial preset positions of the load VVC and the tuning VVC can be optimized for each process step, so that the initial reflected wave power of the process can be suppressed as much as possible and the continuity of process steps can be ensured by quick matching.

BRIEF DESCRIPTION OF DRAWINGS

FIG. 6 is a data log illustrating a result obtained by performing virtual impedance auto matching according to the present invention; and FIG. 7 is a data log illustrating a result obtained by performing impedance matching after applying the optimized initial preset positions of VVCs according to the result of FIG. 6.

MODE FOR INVENTION

Figure 1:
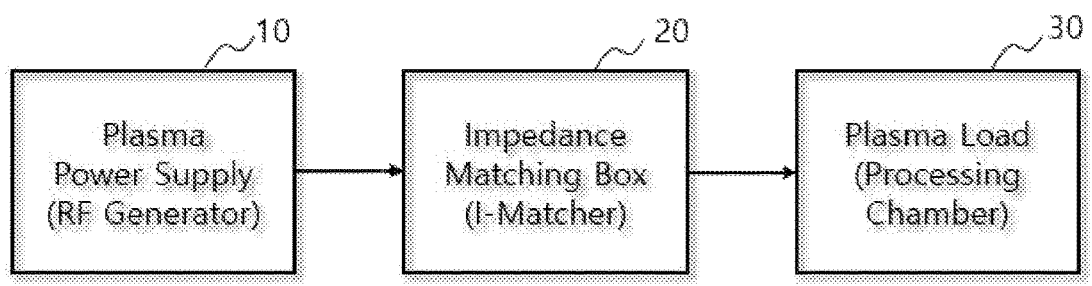
FIG. 1 is a block diagram illustrating a general plasma power supply system.

Hereafter, exemplary embodiments of the present invention will be described with reference to the accompanying drawings. However, the present invention is not intended to be limited to specific embodiments and should be construed to include all modifications, equivalents, and alternatives included in the spirit and scope of the present invention.

Elements having similar configurations and operations throughout the specification are denoted by the same reference numerals. The accompanying drawings of the present invention are for convenience of description and the shapes and relative scales may be exaggerated or omitted.

Figure 3:
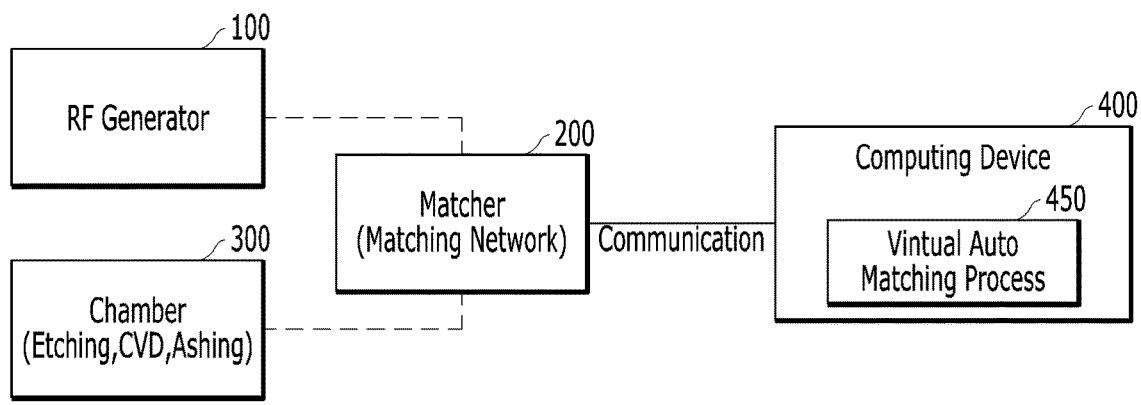
FIG. 3 is a block diagram illustrating a virtual impedance matching system for implementing the present invention.

FIG. 3 is a block diagram illustrating a virtual impedance matching system for implementing the present invention.

A virtual impedance auto matching method of the present invention relates a method of performing virtual matching by connecting an impedance matcher 200 to a computing device 400 before the impedance matcher 200 is put into a process, and as illustrated by a dotted line in FIG. 3, an RF generator 100 and a plasma chamber 300 are not actually connected to each other, but the computing device 400 implements an environment similar to that where the RF generator 100 and the plasma chamber 300 are connected to each other.

As described in the background art of the present invention, the plasma power supply system is used in the semiconductor process such as etching, chemical vapor deposition (CVD), and asking. The RF generator 100 generates an RF signal that oscillates at a high frequency, and the impedance matcher 200 matches the impedance of an output terminal of the RF generator 100 with the impedance of the plasma chamber 300. In the virtual impedance auto matching method of the present invention, functions of the RF generator 100 and the plasma chamber 300 are performed by a virtual impedance matching engine 450 installed in the computing device 400, but the impedance matcher 200 operates in the same manner as in actual process environments. However, some parameters of the impedance matcher 200 may be adjusted by the virtual impedance matching engine 450.

Figure 2:
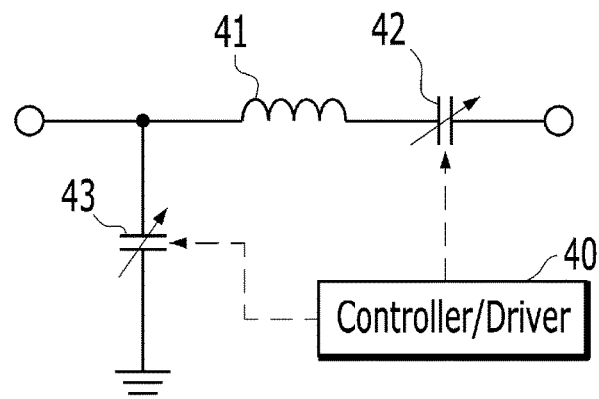
FIG. 2 is a circuit diagram illustrating an impedance matching box including a vacuum variable capacitor.

In order to facilitate the understanding of the present invention, reference may be made to the circuit configuration of the impedance matcher 200 described with reference to FIG. 1 and FIG. 2 in the background art. For example, the impedance matcher 200 includes a matching circuit having an inductor of which inductance value is fixed, a load vacuum variable capacitor (VVC) that varies a capacitance value in order to vary a value corresponding to an active resistance component among impedance components, and a tuning vacuum variable capacitor (hereinafter, vacuum variable capacitor may be referred to as 'VVC') that varies a capacitance value in order to vary a value corresponding to a capacitive component among the impedance components. Furthermore, the impedance matcher 200 includes an operating mechanism that operates the load VVC and the tuning VVC within a predetermined stroke section, and a controller that variably matches impedance by controlling the operating mechanism.

Figure 4:
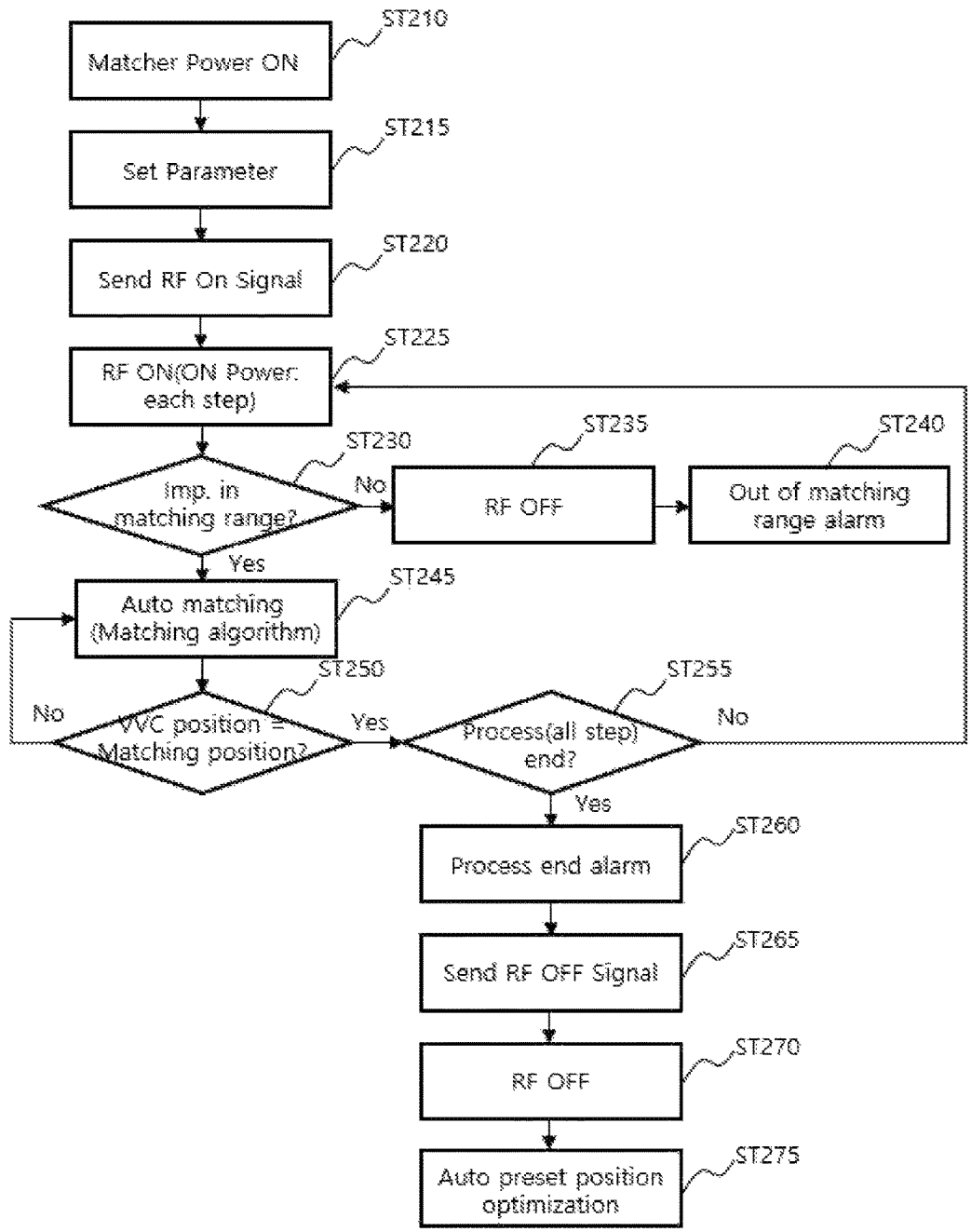
FIG. 4 is a flowchart illustrating a virtual impedance auto matching method according to the present invention.
Figure 5:
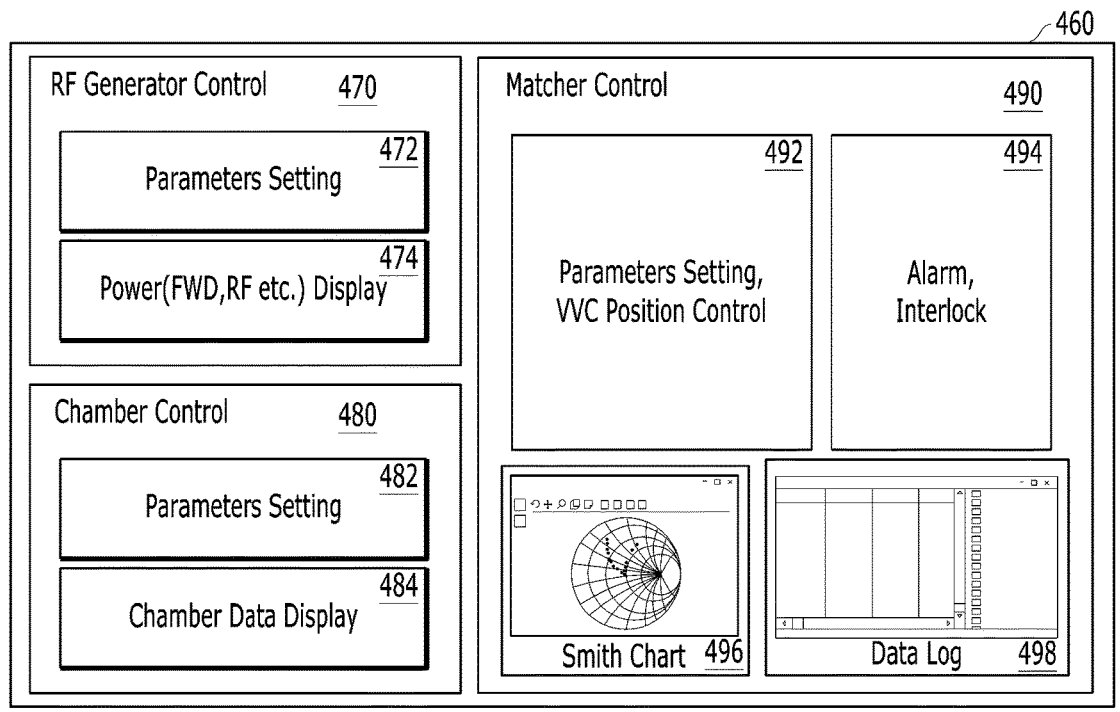
FIG. 5 is a diagram illustrating a configuration of an impedance matching display of a computing device in the present invention.

FIG. 4 is a flowchart illustrating the virtual impedance auto matching method according to the present invention, and FIG. 5 is a diagram illustrating a configuration of an impedance matching display of the computing device in the present invention. With reference to FIG. 4 and FIG. 5, the virtual impedance auto matching method according to the present invention will be described in detail below.

As illustrated in FIG. 3, before the impedance matcher 200 is connected between the RF generator 100 and the plasma chamber 300, which are actual processes, the impedance matcher 200 is connected to the computing device 400 including the virtual impedance matching engine 450. As will be described below, after the virtual impedance matching engine 450 is driven, the impedance matcher 200 is connected between the RF generator 100 and the plasma chamber 300 after the initial preset positions of the load VVC and the tuning VVC of the impedance matcher 200 are optimized, and then is put into the actual processes.

Referring to FIG. 4, the impedance matcher 200 is connected to the computing device 400 and then is powered on (ST210). Then, input parameters of the RF generator 100 and load condition parameters of the plasma chamber 300 are decided according to a process type, a process recipe, and each process step of the process recipe (ST215). For example, the process type is data indicating an actual semiconductor process such as etching, CVD, and asking, and the process recipe is information indicating the intensity of plasma, the type of reaction gas, a time for which a semiconductor workpiece is exposed to the reaction gas, and the like in each process. The process steps refer to steps obtained by separating steps where power characteristics and the like of the RF generator 100 are kept the same by serial numbers according to the process recipe.

The computing device 400 may store a process type, a process recipe included in the process type, and process steps included in the process recipe, or may include a search engine capable of searching for a process type, a process recipe, and process steps in an external database server. The input parameters of the RF generator 100 and the load condition parameters of the plasma chamber 300 may be automatically decided according to the process type, the process recipe, and the process steps.

On the other hand, actual process conditions may be different from process steps stored in advance, and in the case of a process in which a load changes rapidly, since a user may desire to set a more severe environment, the user may input each parameter through an impedance matching display 460 provided in the computing device 400 as illustrated in FIG. 5.

Referring to FIG. 5, the impedance matching display 460 includes an RF generator control 470, a chamber control 480, and a matcher control 490.

The RF generator control 470 includes a parameters setting 472 and a power (FWD, RF etc.) display 474. The parameters setting 472 provides an input window for setting input power, a frequency, a phase and the like of the RF generator. The power (FWD, RF etc.) display 474 measures and displays virtual forward power from the RF generator 100 to the impedance matcher 200 and virtual reflected wave power reflected from the input terminal of the plasma chamber 300 to the impedance matcher 200.

The chamber control 480 includes a parameters setting 482 and a chamber data display 484. The parameters setting 482 provides an input window for setting the aforementioned process type, process recipe, and process steps and load condition parameters such as required power, a reaction gas type, and reaction gas pressure in each process step. The chamber data display 484 displays the parameters inputted for each process step, and data indicating an environmental change in the chamber as the plasma process is performed.

The matcher control 490 includes a parameters setting 492, an alarm 494, a Smith chart 496, and a data log 498. The parameters setting 492 provides an input window for setting selection of an impedance matching algorithm (for example, selection of a magnitude/phase matching algorithm or a model-based prediction matching algorithm), a phase angle, target impedance and the like. The alarm 494 operates when the initial preset positions of the load VVC and the tuning VVC are out of a matching range, and displays an alarm to a user. When the alarm 494 operates, an interlock function is performed to immediately turn off the RF power. The Smith chart 496 displays integrated impedance measured in the impedance matcher 200 using a Smith chart, and the data log 498 measures and displays data by RF ON time together with the process type, the process recipe, and the process steps. The data log will be described below with reference to FIG. 6 and FIG. 7.

Referring back to FIG. 4, the virtual impedance matching engine 450 sends an RF ON signal to the impedance matcher 200 on the basis of the parameters inputted in step ST215 (ST220), and the RF power is supplied to the impedance matcher 200 for each process step (ST225).

Next, it is determined whether the initial preset positions of the load VVC and the tuning VVC in the impedance matcher 200 are within the matching range (ST230). The positions of the load VVC and the tuning VVC may be positions indicating a distance from one end to the other end of an entire stroke section by the operating mechanism as a percentage, and default values are each 50%.

In a case where the impedance matcher 200 has been applied to the actual process, when the initial preset positions of the load VVC and the tuning VVC are out of the matching range, the process is stopped and the initial preset positions needs to be readjusted. Accordingly, in the present invention, in order to prevent such a phenomenon, when step ST230 is not satisfied, the RF power is immediately turned off (ST235) and an alarm signal indicating deviation from the matching range is displayed (ST240).

However, when step ST230 is satisfied, a command is sent to the impedance matcher 200 to start a matching operation (ST245). The impedance matcher 200 performs the matching by an algorithm selected through the parameters setting 492 (a data log to be described below with reference to FIG. 6 and FIG. 7 is matching data by the magnitude/phase matching algorithm).

When the impedance matching is completed, the final positions of the load VVC and the tuning VVC are extracted for each process step where the matching is successful, and optimal initial preset positions are decided by analyzing a magnitude error and a phase error with respect to 50+j0 according to an impedance change.

Firstly, it is determined whether the load VVC and the tuning VVC are located at matching positions (ST250). When the load VVC and the tuning VVC are located at the matching positions, it is determined whether all process steps have been ended (ST255). When there are remaining process steps, the procedure returns to step ST220 and a subsequent process step is performed. When all the process steps have been ended, a process end alarm is generated (ST260) and an RF OFF signal is sent (ST265). Consequently, the RF power is turned off (ST270) and the initial preset positions of the load VVC and the tuning VVC are optimized for each process step (ST275). Then, the initial preset positions of the load VVC and the tuning VVC for each process step are sent to the impedance matcher 200.

Figure 6:
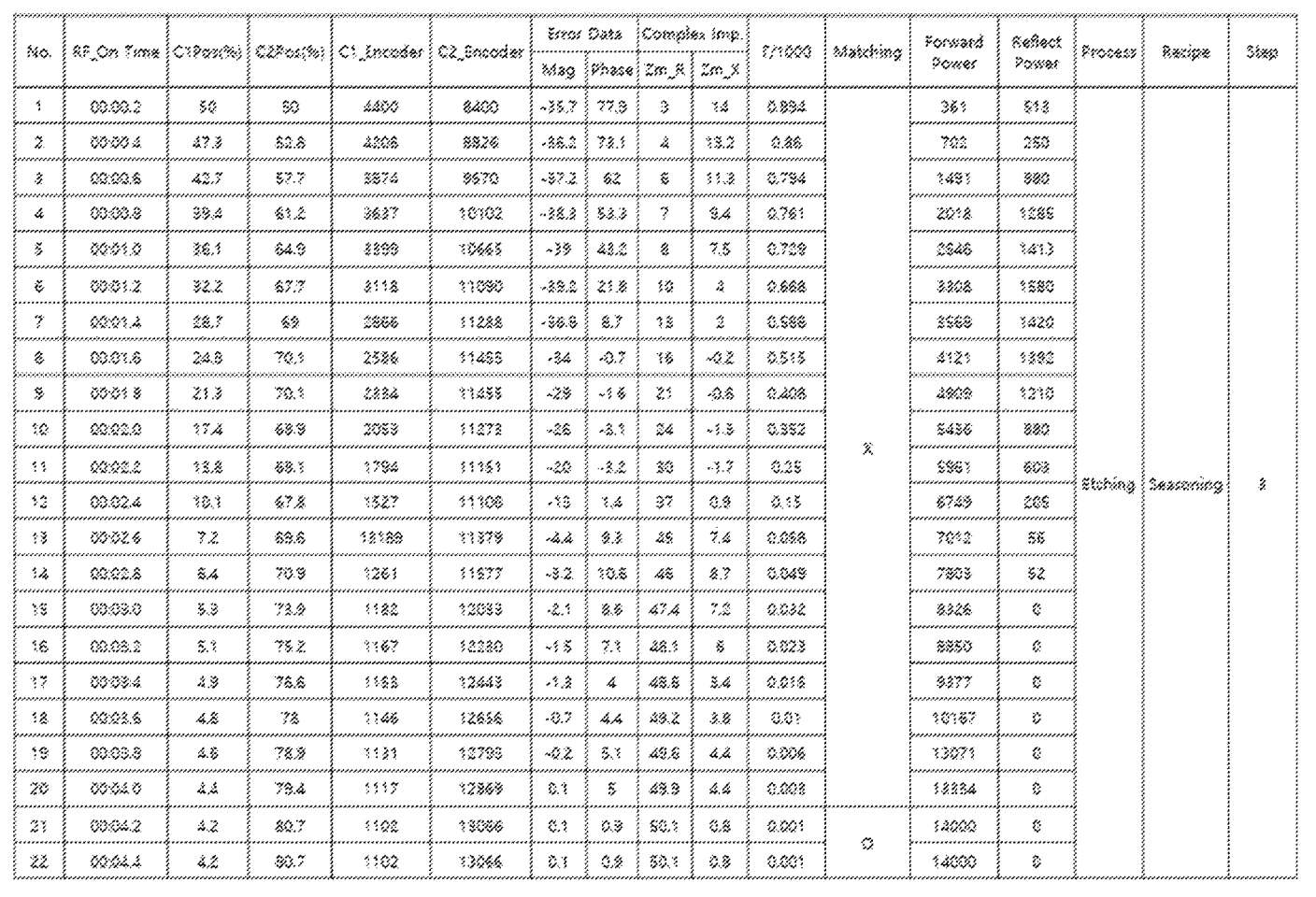

FIG. 6 is a data log illustrating a result obtained by performing the virtual impedance auto matching according to the present invention, and FIG. 7 is a data log illustrating a result obtained by performing the impedance matching after applying the optimized initial preset positions of the VVCs according to the result of FIG. 6.

The data log of FIG. 6 indicates the result when the power outputted from the RF generator is 14 kW, the initial preset positions of the load VVC and the tuning VVC are each set to 50%, and then the auto matching is performed in the third process step in which a seasoning recipe is applied to the etching process.

The data log of FIG. 6 indicates, from the left, a log number (No), an RF ON time (RF_On Time), the position of the load VVC (C1Pos), the position of the tuning VVC (C2Pos), encoding data indicating the position of the load VVC (C1_Encoder), encoding data indicating the position of the tuning VVC (C2_Encoder), error data (Error Data), integrated impedance measured in the impedance matcher (Integrated Impedance), a gamma value ($\gamma/1000$) with respect to 50+j0 of the measured integrated impedance, matching or non-matching (Matching), forward power (Forward Power), reflected wave power (Reflect Power), a process type (Process), a process recipe (Recipe), and a process step (Step).

When a user does not separately set a parameter, the initial preset positions of the load VVC and the tuning VVC are each located at the positions of 50%. In the date error, a magnitude (Mag) error and a phase (Phase) error indicate errors with respect to 50+j0, respectively. When the magnitude error is larger than 0 (zero), the position of the load VVC is increased, and when the magnitude error is smaller than 0 (zero), the position of the load VVC is decreased. When the phase error is larger than 0 (zero), the position of the tuning VVC is increased, and when the phase error is smaller than 0 (zero), the position of the tuning VVC is decreased. The gamma value (γ/1000) for 50+j0 of the integrated impedance measured through such a matching process approximates to 0 (zero). Then, when a gamma value designated by a user is reached, it is determined that matching is successful. In the illustrated example, when a gamma value 0.001 is reached, it is determined that matching is successful. The gamma value indicating matching success may be varied by user's designation.

FIG. 7 illustrates a state in which auto matching has been performed after the matching success and the initial preset positions of the load VVC and the tuning VVC are respectively set to 9.7% and 70.6%. As compared with FIG. 6 in which matching is successful after the RF ON time of 4.2 seconds, it can be confirmed that matching is successful only within 1.4 seconds.

That is, according to the virtual impedance auto matching method of the present invention, the continuity of a process can be prevented from being interrupted by avoiding an unmatchable area when the impedance matcher is applied to an actual process, the matching process can be quickly performed by optimizing the initial preset positions of the vacuum variable capacitors (VVC), the initial reflected wave power of the process can be suppressed as much as possible, and process stability can be improved.

Various modifications can be made in the invention disclosed above without departing from the basic scope. That is, all the above embodiments should be construed to be illustrative and is not construed to be limitative. Accordingly, the protection scope of the present invention should be defined according to the accompanying claims rather than the above embodiments, and when elements defined in the accompanying claims are replaced with equivalents thereof, this is intended to fall within the scope of the present invention.

DESCRIPTION OF REFERENCE NUMERALS OF IMPORTANT PARTS

100: RF generator
200: impedance matcher
300: plasma chamber
400: computing device
450: virtual impedance matching engine
460: impedance matching display
470: RF generator control
472: parameters setting
474: power (FWD, RF etc) display
480: chamber control
482: parameters setting
484: chamber data display
490: matcher control
492: parameters setting
494: alarm
496: Smith chart
498: data log

What is claimed is:

1. A virtual impedance auto matching method in which, virtual matching is performed by connecting an impedance matcher to a computing device before the impedance matcher is put into a process, the impedance matcher being installed between an RF generator that generates an RF signal that oscillates at a high frequency and a plasma chamber to match impedance of an output terminal of the RF generator with impedance of the plasma chamber, the virtual impedance auto matching method comprising the steps of:
   (a) deciding an input parameter of the RF generator and a load condition parameter of the plasma chamber according to a process type, a process recipe, and each process step of the process recipe;
   (b) applying an RF ON signal to the impedance matcher based on the input parameter of the RF generator for each process step;
   (c) determining whether initial preset positions of a load vacuum variable capacitor and a tuning vacuum variable capacitor constituting the impedance matcher are within a matching range;
   (d) applying the RF OFF signal to the impedance matcher and generating an alarm signal indicating deviation from the matching range, when step (c) is not satisfied;
   (e) starting matching by operating the impedance matcher when step (c) is satisfied;
   (f) deciding the initial preset positions of the load vacuum variable capacitor and the tuning vacuum variable capacitor by analyzing a magnitude error and a phase error with respect to 50+j0 according to an impedance change for each process step where the matching is successful, when the matching is completed; and
   (g) performing step (a) to step (f) for each process step and sending the initial preset positions of the load vacuum variable capacitor and the tuning vacuum variable capacitor for each process step to the impedance matcher.

2. The virtual impedance auto matching method of claim 1, wherein step (e) comprises the steps of:
   (e-1) increasing the position of the load vacuum variable capacitor when the magnitude error with respect to impedance of 50+j0 is larger than 0 (zero) and decreasing the position of the load vacuum variable capacitor when the magnitude error with respect to the impedance of 50+j0 is smaller than 0 (zero);
   (e-2) increasing the position of the tuning vacuum variable capacitor when the phase error with respect to the impedance of 50+j0 is larger than 0 (zero) and decreasing the position of the tuning vacuum variable capacitor when the phase error with respect to the impedance of 50+j0 is smaller than 0 (zero); and
   (e-3) deciding completion of the impedance matching when a gamma value with respect to 50+j0 of integrated impedance measured at an output terminal of the impedance matcher reaches a matching reference gamma value designated by a user.

3. The virtual impedance auto matching method of claim 2, wherein, in step (e-3), the completion of the impedance matching is decided on an assumption that reflected wave power due to the load condition parameter of the plasma chamber reaches 0 (zero).

\* \* \* \* \*